US008117569B1

(12) United States Patent
Salowe

(10) Patent No.: US 8,117,569 B1
(45) Date of Patent: Feb. 14, 2012

(54) METHOD AND MECHANISM FOR IMPLEMENTING A MINIMUM SPANNING TREE

(75) Inventor: Jeffrey Scott Salowe, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 12/648,666

(22) Filed: Dec. 29, 2009

Related U.S. Application Data

(62) Division of application No. 10/342,640, filed on Jan. 14, 2003, now Pat. No. 7,676,781.

(51) Int. Cl.
*G06F 17/50* (2006.01)

(52) U.S. Cl. ........ 716/100; 716/103; 716/104; 716/110; 716/111; 716/126

(58) Field of Classification Search .......... 716/100–108, 716/110–111, 126, 130, 136
See application file for complete search history.

(56) References Cited

U.S. PATENT DOCUMENTS

| | | | |
|---|---|---|---|
| 4,831,725 A | 5/1989 | Dunham et al. |
| 5,157,618 A | 10/1992 | Ravindra et al. |
| 5,375,069 A | 12/1994 | Satoh et al. |
| 5,497,334 A | 3/1996 | Russell et al. |
| 5,610,828 A | 3/1997 | Kodosky et al. |
| 5,818,729 A | 10/1998 | Wang et al. |
| 5,831,865 A | 11/1998 | Berezin et al. |
| 5,850,350 A | 12/1998 | Shibuya et al. |
| 5,911,061 A | 6/1999 | Tochio et al. |
| 6,009,250 A | 12/1999 | Ho et al. |
| 6,253,363 B1 | 6/2001 | Gasanov et al. |
| 6,286,128 B1 | 9/2001 | Pileggi et al. |
| 6,292,929 B2 | 9/2001 | Scepanovic et al. |
| 6,324,675 B1 | 11/2001 | Dutta et al. |
| 6,349,403 B1 | 2/2002 | Dutta et al. |

(Continued)

FOREIGN PATENT DOCUMENTS

JP 11066111 A 3/1999

OTHER PUBLICATIONS

Ahuja. R.K. et al., eds, Network Flows, Theory, Algorithms, and Applications (1993) pp. 510-542, Prentice Hall. Upper Saddle River, NJ.

(Continued)

*Primary Examiner* — Paul Dinh

(74) *Attorney, Agent, or Firm* — Vista IP Law Group, LLP

(57) ABSTRACT

Disclosed is an improved method, system, and mechanism for using and constructing a minimum spanning tree. In one approach, each iteration of the process for constructing a minimum spanning tree calculates at most two additional point-pairs for nearest neighbors of points previously added to the tree. These additional point-pairs are appended to a list of point pairs, and the point-pair having the shortest distance is selected and added to the minimum spanning tree. Any metric can be employed to determine nearest neighbors, including Euclidean or Manhattan metrics. An advantage is that not all point-pairs need to be examined, greatly increasing speed and efficiency. Since every point-pair does not have to be examined, a preprocessing step is not required to reduce the number of point-pairs being considered. The resultant minimum spanning tree can be used to facilitate the routing process for an integrated circuit.

20 Claims, 11 Drawing Sheets

U.S. PATENT DOCUMENTS

| | | | |
|---|---|---|---|
| 6,415,426 | B1 | 7/2002 | Chang et al. |
| 6,418,551 | B1 | 7/2002 | McKay et al. |
| 6,442,743 | B1 | 8/2002 | Sarrafzadeh et al. |
| 6,536,024 | B1 | 3/2003 | Hathaway |
| 6,543,039 | B1 | 4/2003 | Watanabe |
| 6,557,145 | B2 | 4/2003 | Boyle et al. |
| 6,560,505 | B1 | 5/2003 | Kikuchi et al. |
| 6,625,611 | B1 | 9/2003 | Teig et al. |
| 6,637,010 | B2 | 10/2003 | Yamamoto |
| 6,701,306 | B1 | 3/2004 | Kronmilier et al. |
| 6,785,874 | B2 | 8/2004 | Tsukuda |
| 6,792,582 | B1 | 9/2004 | Cohn et al. |
| 6,829,754 | B1 | 12/2004 | Yu et al. |
| 6,851,099 | B1 | 2/2005 | Sarrafzadeh et al. |
| 6,857,115 | B1 | 2/2005 | Oasasathyan et al. |
| 6,859,916 | B1 | 2/2005 | Teig et al. |
| 6,871,328 | B1 | 3/2005 | Fung et al. |
| 6,904,584 | B2 | 6/2005 | Brenner et al. |
| 6,961,916 | B2 | 11/2005 | Sarrafzadeh et al. |
| 2001/0003843 | A1 | 6/2001 | Scepanovic et al. |
| 2001/0010090 | A1 | 7/2001 | Boyle et al. |
| 2002/0029370 | A1 | 3/2002 | Michalewicz et al. |
| 2002/0038445 | A1 | 3/2002 | Yamamoto |
| 2002/0059194 | A1 | 5/2002 | Choi et al. |
| 2002/0116686 | A1 | 8/2002 | Shin et al. |
| 2002/0138816 | A1 | 9/2002 | Sarrafzadeh et al. |
| 2002/0147958 | A1* | 10/2002 | Teig et al. ............ 716/12 |
| 2002/0174412 | A1 | 11/2002 | Teig et al. |
| 2003/0066045 | A1 | 4/2003 | Teig et al. |
| 2003/0088839 | A1 | 5/2003 | Watanabe |
| 2003/0163297 | A1 | 8/2003 | Khaira et al. |
| 2003/0217338 | A1 | 11/2003 | Holmes et al. |
| 2004/0040007 | A1 | 2/2004 | Harn |
| 2004/0044980 | A1 | 3/2004 | Juengling |
| 2004/0060022 | A1 | 3/2004 | Allen et al. |
| 2005/0204325 | A1 | 9/2005 | Fung et al. |

OTHER PUBLICATIONS

Al-Yamani. A., et al. "HPTS: Heterogeneous Parallel Tabu Search for VLSI Placement" Proceedings of the 2002 Congress on Evolutionary Computation (May 12-17, 2002) 1:351-355.

Anderson, R., et al., "An O(n log n) Algorithm for 1-0 Tile Compaction" ICCAD-89—International Conference on Computer-Aided Design (Nov. 5-9, 1989) pp. 144-147.

Balasa, F., et al., "Efficient Solution Space Exploration Based on Segment Trees in Analog Placement with Symmetry Constraints" in IEEE/ACM International Conference on Computer Aided Design (Nov. 10-14, 2002) pp. 497-502.

Barzaghi, M. et al. "Hierarchical Management of VLSI Cells at Different Description Levels" Proceedings of the 6th Mediterranean Electrotechnical Conference (May 22-24, 1991) 1:327-330.

Benetis, R. et al. "Nearest Neighbor and Reverse Nearest Neighbor Queries for Moving Objects" Proceedings of the International Database Engineering and Applications Symposium (IDEAS'02) (Jul. 17-19, 2002) pp. 44-53.

Bern, J. et al. "Some Heuristics for Generating Tree-like FBDD Types" IEEE Transactions on Computer-Aided Design of Integrated Circuits and Systems (Jan. 1996) 15(1 ):127-130.

Bhattacharya, S. and W.-T. Tsai Area Efficient Binary Tree Layout 1st Great Lakes Symposium on VLSI (Mar. 1-2, 1991) pp. 18-24.

Blust. G. and D.P. Mehta "Corner Stitching for L-shaped Tiles" Proceedings of the ;tri Great Lakes Symposium on VLSI, Design Automation of High Performance VLSI Systems (Mar. 5-6, 1993) pp. 67-68.

Borah, M. et al. "An Edge-Based Heuristic for Steiner Routing" IEEE Transactions on Computer-Aided Design of Integrated Circuits and Systems (Dec. 1994) 13(12):1563-1568.

Bruck, R. and H. Wronn"—geoADDICTION—Flexible Handling of Geometries in IC-Layout Tools" ISCAS '88—IEEE International Symposium on Circuits and Systems (Jun. 7-9, 1988) 1:723-726.

Cadence Design Systems, Inc. IC Shape-Based Technology Chip Assembly User Guide Product Version 11.0 (Nov. 2001).

Carlson, E.C. and R.A. Rutenbar "A Scanline Data Structure Processor for VLSI Geometry Checking" IEEE Transactions on Computer-Aided Design (Sep. 1987) 6(5):780-794.

Cheung, P. and J. Hesketh "Design Automation Tools for Tile-Based Analogue Cells" IEE Colloquium on New Directions in VLSI Design (Nov. 27, 1989) pp. 3/1-3/5.

Chiang, C. and C.-S. Chiang "Octilinear Steiner Tree Construction" MWSCAS-2002—The 2002 45th Midwest Symposium on Circuits and Systems (Aug. 4-7, 2002) 1 :603-606.

Christian, B.S. et al. "A VLSI Interval Router for High-Speed Networks" Canadian Conference on Electrical and Computer Engineering (May 26-29, 1996) 1: 154-157.

Cong, J. et al. "Multilevel Approach to Full-Chip Gridless Routing" ICCAD 2001—IEEE/ACM International Conference on Computer-Aided Design (Nov. 4-8, 2001) pp. 396-403.

Curatelli, F. et al. "Efficient Management of Complex Elements in Physical IC Design" Proceedings of the IEEE International Symposium on Circuits and Systems (May 1-3, 1990) 1 :456-459.

Das, S. and B.B. Bhattacharya "Channel Routing in Manhattan-Diagonal Model" Proceedings of the 9th International Conference on VLSI Design (Jan. 3-6, 1996) pp. 43-48.

Dasgupta, P. et al. "Multiobjective Search in VLSI Design" Proceedings of the 7th International Conference on VLSI Design (Jan. 1994) pp. 395-400.

Dasgupta, P. et al. "Searching Networks With Unrestricted Edge Costs" IEEE Transactions on Systems, Man and Cybemetics—Part A: Systems and Humans (Nov. 2001) 31(6):497-507.

de Dood, P. et al. "A Two-Dimensional Topological Compactor With Octagonal Geometry" 28th ACM/IEEE Automation Conference (1991) pp. 727-731.

Dijkstra, E.W."A Note on Two Problems in Connexion with Graphs" Numerische Mathematik (1959) 1:269-271.

Dinitz, Y. et al. "On the Single-Source Unsplittable Flow Problem" Proceeding of the 39th Annual IEEE Symposium on Foundation of Computer Science, Nov. 1998, pp. 290-299.

Doong, K.Y.-Y. et al. "Infrastructure Development and Integration of Electrical-Based Dimensional Process Window Checking" IEEE Transactions on Semiconductor Manufacturing (May 2004) 17(2):123-141.

Dutt, S. "New Faster Kernlghan-Lin-Type Graph-Partitioning Algorithms" ICCAD-93—1993 IEEE/ACM International Conference on Computer-Aided Design (Nov. 7-11, 1993) pp. 370-377.

Facanha, H.S. et al. "Data structures for physical representation of VLSI" Software Engineering Journal (Nov. 1990) 5(6):339-349.

Facanha, H.S. et al. "Layout Tool for High Speed Electronic and Optical Circuits" IEE Colloquium on Analogue IC Design: Obstacles and Opportunities (Jun. 18, 1990) pp. 3/1-3/5.

Fang, J.P. and S.J. Chen "Tile-Graph-Based Power Planning" ISCAS'03—Proceedings of the 2003 International Symposium on Circuits and Systems (May 25-28, 2003) 5:V-501-V-504.

Faroe, O. et al. "Local Search for Final Placement in VLSI Design" ICCAD 2001—IEEE/ACM International Conference on Computer-Aided Design (Nov. 4-8, 2001) pp. 565-572.

Gannett, J,W. "Shortfinder: A Graphical CAD Tool for Locating Net-to-Net Shorts in VLSI Chip Layouts" IEEE Transactions on Computer-Aided Design (Jun. 1990) 9(6):669-674.

Grgek, M. et al. "Performance Comparison of Several Data Structures for Storing VLSI Geometry" The IEEE Region 8 EUROCON 2003, Computer as a Tool (Sep. 22-24, 2003) 1: 156-159.

Guibas, L.J. and J. Stolfi "On Computing All North-East Nearest Neighbors in the L1 Metric" Information Processing Letters (Nov. 8, 1983) 17:219-223.

Hettiaratchi, S. and P. Y.K. Cheung "A novel implementation of tile-based address mapping" DATE'04—Proceedings of the Design, Automation and Test in Europe Conference and Exhibition (Feb. 16-20, 2004) 1 :306-310.

Hsiao, P.-Y. and W.-S. Feng "Using a Multiple Storage Quad Tree on a Hierarchical VLSI Compaction Scheme" IEEE Transactions on Computer-Aided Design (May 1990) 9(5):522-536.

Hsiao, P.-Y. et al. "Optimal tile partition for space region of integrated circuits geometry" IEEE Proceedings-E (May, 1993) 140(3):145-153.

Hur, S.-W. and J. Lillas "Relaxation and Clustering in a Local Search Framework: Application to Linear Placement" Proceedings of the 36th Design Automation Conference (Jun. 21-25, 1999) pp. 360-366.

Hwang, F.K. "An O(n log n) Algorithm for Rectilinear Minimal Spanning Trees" JACM (Apr. 1979) 26(2):177-182.

Iwasaki, H. et al. "An Effective Data Structure for VLSI Layout Systems" Proceedings of the IEEE International Symposium on Circuits and Systems (Jun. 11-14, 1991) 5:3134-3137.

Johann, M. and R. Reis "Net by Net Routing with a New Path Search Algorithm" Proceedings of the 13th Symposium on Integrated Circuits and Systems Design (Sep. 18-24, 2000) pp. 144-149.

Kim, H.S. et al. "An Efficient CPLD Technology Mapping Under the Time Constraint" Proceedings of the 12th Int'l Conference on Microelectronics, Oct. 31-Nov. 2, 2000, pp. 265-268.

Kiyota, K. and K. Fujiyoshi "Simulated Annealing Search Through General Structure Floorplans Using Sequence-Pair" ISCAS 2000—Proceedings of the 2000 IEEE International Symposium on Circuits and Systems, Geneva, Switzerland (May 28-31, 2000) 3:77-80.

Koh, C.-K. and P.H. Madden "Manhattan or Non-Manhattan? A Study of Alternative VLSI Routing Architectures" Proceedings of the 10th Great Lakes Symposium on VLSI (Mar. 2000) pp. 47-52.

Kruskal, Jr., J.B. "On the Shortest Spanning Subtree of a Graph and the Traveling Salesman Problem" Proc. Amer. Math. Soc. (1956) pp. 48-50.

Ku, L.-P. and H,W. Leong "Note on optimal tile partition for space region of integrated-circuit geometry" IEEE Proceedings on Computers and Digital Techniques (Jul. 1996) 143(4):246-248.

Kubo. Y. et al. "Self-Reforming Routing for Stochastic Search in VLSI Interconnection Layout" Proceedings of the ASP-DAC 2000 Asia South Pacific Design Automation Conference (Jan. 25-28, 2000) pp. 87-92.

Kuh. E.S. and T. Ohtsuki "Recent Advances in VLSI Layout" Proceedings of the IEEE (Feb. 1990) 78(2):237-263.

Kunii. T.L. et al. "Hierarchic Shape Description via Singularity and Multiscaling" COMPSAC 94—Proceedings of the 18th Annual International Computer Software and Applications Conference (Nov. 9-11, 1994) pp. 242-251.

Lai, G.G. et al. "Hinted Quad Trees for VLSI Geometry DRC Based on Efficient Searching for Neighbors" IEEE Transactions on Computer-Aided Design of Integrated Circuits and Systems (Mar. 1996) 15(3):317-324.

Lai, Y.-K. et al. "An Efficient Array Architecture with Data-Rings for 3-Step Hierarchical Search Block Matching Algorithm" 1997 IEEE International Symposium on Circuits and Systems, Hong Kong (Jun. 9-12, 1997) 2:1361-1364.

Liao, S. et al. "An Efficient External-Memory Implementation of Region Query with Application to Area Routing" (ICCD'02)—Proceedings of the 2002 IEEE International Conference on Computer Design: VLSI in Computers and Processors (Sep. 16-18, 2002) pp. 36-41.

Lin, Y.-L. et al. "Hybrid Routing" IEEE Transactions on Computer-Aided Design (Feb. 1990) 9(2):151-157.

Lin, Y.-L. et al. "Routing Using a Pyramid Data Structure" ICCAD-89—1989 International Conference on Computer-Aided Design (Nov. 5-9, 1989) pp. 436-439.

Linhares, A. "Synthesizing a Predatory Search Strategy for VLSI Layouts" IEEE Transactions on Evolutionary Computation (Jul. 1999) 3(2):147-152.

Lodha, S.K. and D. Bhatia "Bipartitioning Circuits using TABU Search" Proceedings of the 11th Annual IEEE International ASIC Conference (Sep. 13-16, 1998) pp. 223-227.

Luk, W.K. and A.A. Dean "Multistack Optimization for Data-Path Chip Layout" IEEE Transactions on Computer-Aided Design (Jan. 1991) 10(1):116-129.

Margarino, A. et al. "A Tile-Expansion Router" IEEE Transactions on Computer-Aided Design (Jul. 1987) 6(4):507-517.

Marple, D. et al. "Tailor: A Layout System Based on Trapezoidal Corner Stitching" IEEE Transactions on Computer-Aided Design (Jan. 1990) 9(1):66-90.

Mehta, D. and G. Blust Corner Stitching for Simple Rectilinear Shapes IEEE Transactions on Computer-Aided Design of Integrated Circuits and Systems (Feb. 1997) 16(2): 186-198.

Modarres, H. and R.J. Lomax "A Formal Approach to Design-Rule Checking" IEEE Transactions on Computer-Aided Design (Jul. 1987) 6(4):561-573.

Nakatake, S. et al. "Consistent Floorplanning with Hierarchical Superconstraints" IEEE Transactions on Computer-Aided Design of Integrated Circuits and Systems (Jan. 2002) 21 (1 ):42-49.

Oten, R. and R. J.P. de Figueiredo "Topological Dimensionality Determination and Dimensionality Reduction Based on Minimum Spanning Trees" ISCAS '98—Proceedings of the 1998 IEEE International Symposium on Circuits and Systems (May 31-Jun. 3, 1998) 3:366-369.

Pitaksanonkul, A. et al. "Comparisons of Quad Trees and 4-D Trees: New Results" IEEE Transactions on Computer-Aided Design (Nov. 1989) 8(11 ):1157-1164.

Powers, K.D. et al. "The 60" Grid: Routing Channels in Width D/3" Proceedings of the 1st Great Lakes Symposium on VLSI (Mar. 1-2, 1991) pp. 214-219.

Preparata, F.P. and M.1. Shamos, Computational Geometry an Introduction (1985) Springer-Verlag New York Inc.

Prim, R.C. "Shortest Connection Networks and Some Generalizations" The Bell System Technical Journal (Nov. 1957) 36(6):1389-1401.

Rothermel, H.-J. and D.A. ML Ynski "Automatic Variable-Width Routing for VLSI" IEEE Transactions on Computer-Aided Design (Oct. 1983) 2(4):271-284.

Sait, S.M. et al. "Performance and Low Power Driven VLSI Standard Cell Placement using Tabu Search" CED '02—Proceedings of the 2002 Congress on Evolutionary Computation (May 12-17, 2002) 1 :372-377.

Sakanushi, K. and Y. Kajitani "The Quarter-State Sequence (Q-sequence) to Represent the Floorplan and Applications to Layout Optimization" IEEE APCCAS 2000—The 2000 IEEE Asia-Pacific Conference on Circuits and Systems (Dec. 4-6, 2000) pp. 829-832.

Salek, A.H. et al. "Hierarchical Buffered Routing Tree Generation" IEEE Transactions on Computer-Aided Design of Integrated Circuits and Systems (May 2002) 21 (5):554-567.

Sarrafzadeh, M. et al. "Single-Layer Global Routing" IEEE Transactions on Computer-Aided Design of Integrated Circuits and Systems (Jan. 1994) 13(1 ):38-47.

Schmiedle, F. et al. "Exact Routing with Search Space Reduction" IEEE Transactions on Computers (Jun. 2003) 52(6):815-825.

Sequin, C.H. and H. da Silva Facanha "Corner-Stitched Tiles with Curved Boundaries" IEEE Transactions on Computer-Aided Design of Integrated Circuits and Systems (Jan. 2003) 12(1 ):47-58.

Serdar, T. and C. Sechen "Automatic Datapath Tile Placement and Routing" Conference and Exhibition on Design, Automation and Test in Europe (Mar. 13-16, 2001) pp. 552-559.

Sim, S.-P. et al. "Analytical Capacitance Model for High-Speed Interconnects with Diagonal Routing" Proceedings of the IEEE 2002 International Interconnect Technology Conference (Jun. 3-5, 2002) pp. 157-158.

Su, S.J. and Y.S. Kuo "Multicell Quad Trees" Proceedings of the 3rd European Conference on Design Automation (Mar. 16-19, 1992) pp. 147-151.

Sun, PK "An Octagonal Geometry Compactor" Proceedings of the 1998 IEEE International Conference on Computer Design: VLSI in Computers and Processors-ICCD'88 (Oct. 3-5, 1988) pp. 190-193.

Suzuki, G. et al. "MOSAIC: A Tile-Based Datapath Layout Generator" ICCAD-92—1992 IEEE/ACM International Conference on Computer-Aided Design (Nov. 8-12, 1992) pp. 166-170.

Tan, X. and X. Song "Improvement on the diagonal routing model" IEEE Proceedings on Circuits, Devices and Systems (Dec. 1994) 141(6):535-536.

Tarjan, R.E., ed. Data Structures and Network Algorithms Society for Industrial and Applied Mathematics, Philadelphia, PA (1983) pp. 71-83.

Tsai, C.-C. et al. "An H-V Alternating Router" IEEE Transactions on Computer-Aided Design (Aug. 1992) 11(8):976-991.

Tseng, H.-P. and C. Sechen "A Gridless Multi-Layer Router for Standard Cell Circuits using CTM Cells" ED&TC 97—Proceedings of the European Design and Test Conference (Mar. 17-20, 1997) pp. 319-326.

Tseng, H.-P. and C. Sechen "A Gridless Multilayer Router for Standard Cell Circuits Using CTM Cells" IEEE Transactions on Computer-Aided Design of Integrated Circuits and Systems (Oct. 1999) 18(10):1462-1479.

Tzionas, P.G. et al. "A New, Cellular Automaton-Based, Nearest Neighbor Pattern Classifier and Its VLSI Implementation" IEEE Transactions on Very Large Scale Integration (VLSI) Systems (Sep. 1994) 2(3):343-353.

van der Meijs, N.A. and A.J. van Genderen "An Efficient Algorithm for Analysis of Non-Orthogonal Layout" ISCAS '89—IEEE International Symposium on Circuits and Systems (May 8-11, 1989) 1:47-52.

van der Meijs, N.P. and A.J. van Genderen "Space-Efficient Extraction Algorithms" Proceedings of the 3rd European Conference on Design Automation (Mar. 16-19, 1992) pp. 520-524.

Wu, G.M. et al. "Rectilinear Block Placement Using B*-Trees" Proceedings of the International Conference on Computer Design (Sep. 17, 2000) pp. 351-356.

Xing, Z. and R. Kao "Shortest Path Search Using Tiles and Piecewise Linear Cost Propagation" IEEE Transactions on Computer-Aided Design of Integrated Circuits and Systems (Feb. 2002) 21(2):145-158.

Xu, N. et al. "TSCSP: Tabu Search Algorithm for VLSI Module Placement Based on the Clustering Sequence-Pair" 5th International Conference on ASIC (Oct. 21-24, 2003) 1:306-310.

Yamazaki, H. et al. "Optimum Packing of Convex-Polygons by a New Data Structure Sequence-Table" IEEE APCCAS 2000—The 2000 IEEE Asia-Pacific Conference on Circuits and Systems (Dec. 4-6, 2000) pp. 821-824.

Yan, Z. et al. "Area Routing Oriented Hierarchical Corner Stitching with Partial Bin" Proceedings of the ASP-DAC 2000 Asia-South Pacific Design Automation Conference (Jan. 25-28, 2000) pp. 105-110.

Yeh, Y.H. et al. "Cost Effective VLSI Architectures and Buffer Size Optimization for Full-Search Block Matching Algorithms" IEEE Transactions on Very Large Scale Integration (VLSI) Systems, Sep. 1999, vol. 7, No. 3 pp. 345-358.

Yu, Z. et al. "Layout-based 3D Solid Modeling for IC" Proceedings of the 1995 International Symposium on VLSI Technology, Systems and Applications (May 31-Jun. 2, 1995) pp. 108-112.

Zhang, Y. et al. "A Gridless Router Based on Hierarchical PB Corner Stitching Structure" IEEE 2002 International Conference on Communications, Circuits and Systems and West Sino Expositions (Jun. 29-Jul. 1, 2002) 2:1438-1443.

Zheng, S.Q. et al. "Efficient Maze-Running and Line-Search Algorithms for VLSI Layout" Proceedings of the IEEE Southeastcon '93 (Apr. 4-7, 1993) 7 p.

Zheng, S.Q. et al. "Finding Obstacle-Avoiding Shortest Paths Using Implicit Connection Graphs" IEEE Transactions on Computer-Aided Design of Integrated Circuits and Systems (Jan. 1996) 15(1):103-110.

Zheng, S.Q. et al. "Routing Using Implicit Connection Graphs" 9th International Conference on VLSI Design (Jan. 3-6, 1996) pp. 49-52.

Zhu, Q. et al. "On the Optimal Search Problem: The Case when the Target Distribution Unknown" Proceedings of the XVII Int'l Conference of the Chilean Computer Science Society, Nov. 10-15, 1997, pp. 268-277.

* cited by examiner

Points and Point-Pairs in Tree = { }

Points Not In Tree = { A, B, C, D, E }

Point-Pair List = { }

Points and Point-Pairs in Tree = { A-B }

Points Not in Tree = { C, D, E }

Point-Pair List = { }

---

Assume Vertex = A
Assume B is the nearest neighbor to A

Points and Point-Pairs in Tree = { A-B }

Points Not in Tree = { C, D, E }

Point-Pair List = { B-C, A-E }

---

Assume C is nearest neighbor to B

Assume E is nearest neighbor to A

Points and Point-Pairs in Tree = { A-B, B-C }

Points Not in Tree = { D, E }

Point-Pair List = { A-E }

-------------------------------------------------

Assume distance$_{B-C}$ < distance$_{A-E}$

Points and Point-Pairs in Tree = { A-B, B-C }

Points Not in Tree = { D, E }

Point-Pair List = { A-E, B-D, C-D }

---

Assume distance$_{A-C}$ < { distance$_{B-D}$ , distance$_{A-E}$ }

Assume D is next nearest neighbor to C

Points and Point-Pairs in Tree = { A-B, B-C, C-D }

Points Not in Tree = { E }

Point-Pair List = { A-E, B-D }

---

Assume $distance_{C-D}$ < { $distance_{B-D}$ , $distance_{A-E}$ }

Points and Point-Pairs in Tree = { A-B, B-C, C-D }

Points Not in Tree = { E }

Point-Pair List = { A-E, B-D, D-E, C-E }

---
Assume E is nearest neighbor to D

Assume E is nearest neighbor to C

Points and Point-Pairs in Tree = { A-B, B-C, C-D, D-E }

Points Not in Tree = { }

Point-Pair List = { A-E, ~~B-D~~, D-E, C-E }

---

Assume distance$_{B-D}$ < {distance$_{A-E}$ , distance$_{D-E}$ , distance$_{C-E}$}

Points and Point-Pairs in Tree = { A-B, B-C, C-D, D-E }

Points Not in Tree = { }

Point-Pair List = { A-E, D-E, C-E, B-E }

---

Assume distance$_{D-E}$ < {distance$_{A-E}$ , distance$_{B-E}$ , distance$_{C-E}$}

Points and Point-Pairs in Tree = { A-B, B-C, C-D, D-E }

Points Not in Tree = { }

METHOD AND MECHANISM FOR IMPLEMENTING A MINIMUM SPANNING TREE

CROSS-REFERENCE TO RELATED APPLICATION(S)

This application is a Divisional of U.S. Non-Provisional application Ser. No. 10/342,640, filed Jan. 14, 2003, and is fully incorporated herein by reference for all purposes.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent files and records, but otherwise reserves all other copyright rights.

BACKGROUND

The invention relates to a method and mechanism for using and implementing a minimum spanning tree. A minimum spanning tree is the shortest tree that connects a set of points in space. A Euclidean minimum spanning tree is the shortest tree in which the distance between a pair of points is the Euclidean distance.

Numerous advantages in many fields can be achieved by being able to efficiently construct a minimum spanning tree. For example, consider the process for designing an integrated circuit ("IC"). An IC is a small electronic device typically formed from semiconductor material. Each IC contains a large number of electronic components, e.g., transistors, that are wired together to form a self-contained circuit device. The components and wiring on the IC are materialized as a set of geometric shapes that are "placed and routed" on the chip material. During placement, the location and positioning of each geometric shape corresponding to an IC component are identified on the IC layers. During routing, a set of routes are identified to tie together the geometric shapes for the electronic components.

Constructing a minimum spanning tree is particularly useful with respect to the routing step. The minimum spanning tree provides a projection of the shortest connectivity that can be achieved between the components on the IC chip. This projection of the shortest connectivity can be used to develop a general mapping for how the chip should be routed, or even as the initial routing plan for the chip.

To explain approaches for constructing a minimum spanning tree, a useful term to describe is the "cut", which is a subset of the points. A point-pair crosses the cut if one point is in the cut and the second point is outside the cut. Typically, the cut is a set of vertices that are currently connected in a partially-constructed minimum spanning tree, and the point-pair of interest is a point-pair that crosses the cut that are nearest to each other. The efficiency and speed for determining a minimum spanning tree is highly dependant upon the number of point-pairs to be considered.

Examples of known approaches for constructing a minimum spanning tree are the Prim, Kruskal and Sollin approaches, each of which calls for enumeration for all of the point-pairs involving vertex v that cross the cut formed by T'. In the Kruskal approach, the point-pairs are sorted and are considered in order. In the Prim and Sollin approaches, point-pairs are calculated for every point in the tree against every other point, and the point-pair having the shortest distance is added to the tree. These actions repeat until all points are added to the tree. In effect, all point-pairs must be enumerated at every stage of the process to determine the next point/vertex to add to the tree. A significant drawback to these approaches is that since an advanced IC chip may potentially contain a large number of points (components) to route together, requiring enumeration of every point-pair in the layout to form a minimum spanning tree could be prohibitively expensive.

A preprocessing step can be performed to specify a subset of the point-pairs to consider for the traditional approaches. However, such preprocessing steps are complicated to implement and may consume considerable time and computing resources.

SUMMARY

The present invention provides an improved method, a system, a computer program product comprising a computer usable storage medium storing the executable code which, when executed by a computer, causes the computer to perform the improved method, and a mechanism for using and constructing a minimum spanning tree. In one embodiment, each iteration of the process for constructing a minimum spanning tree calculates at most two additional point-pairs for nearest neighbors of points previously added to the tree. These additional point-pairs are appended to a list of point pairs, and the point-pair having the shortest distance is selected and added to the minimum spanning tree. Any metric can be employed to determine nearest neighbors, including Euclidean or Manhattan metrics. Embodiments of the invention have an advantage that not all point-pairs need to be examined, greatly increasing speed and efficiency. Since every point-pair does not have to be examined, a preprocessing step is not required to reduce the number of point-pairs being considered. The resultant minimum spanning tree can be used to facilitate the routing process for an integrated circuit.

Other and additional objects, features, and advantages of the invention are described in the detailed description, figures, and claims.

DETAILED DESCRIPTION

The present invention provides an improved method, system, and mechanism for using and constructing a minimum spanning tree.

Figure 1:
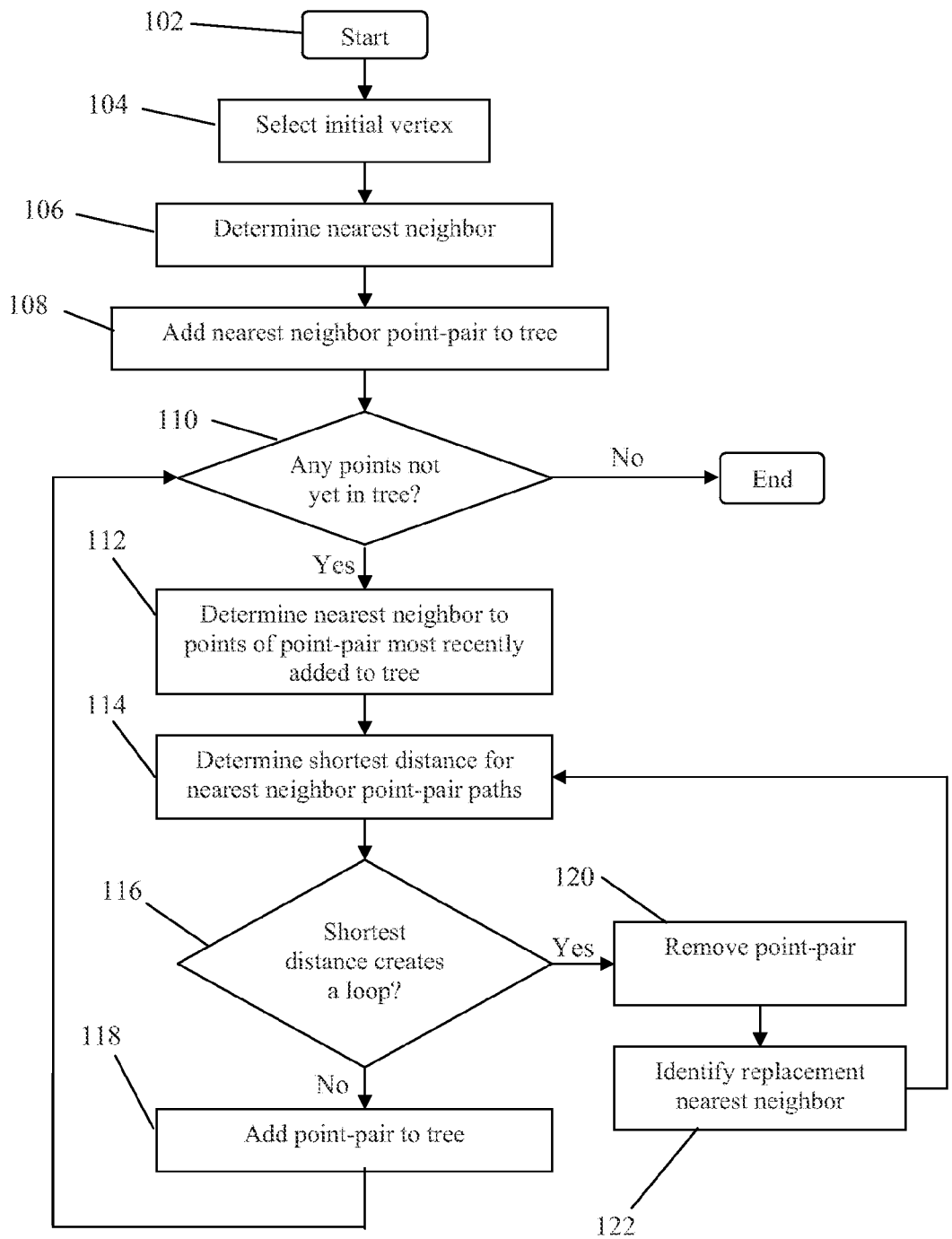
FIG. 1 shows a flowchart of an embodiment of a process for constructing a minimum spanning tree.

FIG. 1 shows a flowchart of an embodiment of the invention. Assume that T refers to the partially built minimum spanning tree. Initially, T contains a single vertex s (104). The single vertex s can be any point selected from the available set of points V. A point is not necessarily a zero-dimensional object; it could be any geometric object. The available set of points V refers to the set of points, components, or geometric objects/shapes for which it is desirable to construct a minimum spanning tree and/or to route together. A point-pair list L is maintained to track a set of point-pairs that may be added to the tree T. Any suitable data structure may be employed to maintain the tree T or list L.

At 106, the nearest neighbor point in V to vertex s is identified. This action identifies the point that is the closest distance to the vertex s. If the "point" is actually a geometric shape, then the closest location(s) on the geometric shape to the neighbor(s) can be considered when determining the closest distance. The point-pair list L is modified to contain a single point-pair consisting of vertex s and its nearest neighbor in V. For a Euclidean minimum spanning tree, this action identifies the point having the Euclidean closest distance to vertex s. The invention is not limited to the Euclidean metric. Other nearest-neighbor approaches are available for additional metrics, such the Manhattan metric used for IC routing. Any suitable approach for determining a nearest neighbor can be employed in 106, such as the approach for performing a nearest neighbor determination disclosed in co-pending U.S. application Ser. No. 10/342,768, which is now U.S. Pat. No. 6,981,235 and is entitled "Nearest Neighbor Mechanism", filed on even date herewith, which is hereby incorporated by reference in its entirety.

At 108, the identified point-pair is added to the minimum spanning tree T. If the initial point-pair was added to point-pair list L, then it is removed from L at this time. In an alternate embodiment, the initial point-pair is not added to L and therefore is not deleted at this time.

A determination is then made whether there are any additional points in V that are not yet in T (110). If there are no more points, then the entire tree has been constructed and the process ends. If there are additional points, then the process continues to 112.

At 112, the nearest neighbor determination is performed for each of the points for the point-pair most recently added to T. Nearest neighbors are selected from those points that are not yet in tree T. The identified point-pairs are stored in the point-pair list L. At 114, the process selects (u,v), the shortest point-pair path stored in a point-pair list L.

At 116, a determination is made whether the shortest point-pair path in list L forms a loop with existing points in tree T. This determination can be made by identifying whether both points in the point-pair are already in T. If so, then the shortest point-pair is removed from L (120). Another nearest neighbor calculation is performed to identify a replacement point-pair for the removed point-pair in L (122). Specifically, if (u,v) is in a loop, then a nearest neighbor of u that is not currently in T is found, say w, and (u,w) replaces (u,v). The process then returns to 114. If the shortest point-pair (u,v) loop in L does not form a loop, then it is added to minimum spanning tree T. The point-pair is then removed from list L. In other words, if (u,v) crosses the cut, then add (u,v) to the tree T to form tree T'. The process then adds the nearest neighbor of u in (V−T') to the point-pair list, and adds the nearest neighbor of v in (V−T') to the point-pair list. The process then returns back to 110, and loops until all points in V have been added to the tree T.

The following describes pseudo code for implementing an embodiment of the invention, where "NN( )" refers to the selected nearest-neighbor calculation:

1. Let T={s}, L={(s, NN(s, V−T))}
2. while (T!=V)
3. (u,v)=remove shortest pair from L
4. if u and v are in the same connected component of T
5. L=L U{(u, NN(u, V−T))}
6. else
7. T=T U{v}
8. L=L U {(u, NN(u, V−T))} U {(v, NN(v, V−T))}

In this example pseudo code, line 1 initializes the partially constructed tree and the point-pair list L, as described in 104-106 of FIG. 1. Line 2 begins a loop which ends when all of the points have been added to the tree. Line 3 removes the shortest pair from the point-pair list L. Line 4 checks to see whether this point-pair induces a cycle in T. If so, then line 5 is performed. Otherwise, lines 7 and 8 are performed. If line 5 is performed, then the nearest neighbor list is updated. In the point-pair, it is assumed that the first point is in T. Then u and its nearest neighbor with respect to the current cut are added to the point-pair list. If step 7 and 8 are run, the tree is updated, and two pairs are added to the list L. These pairs are the nearest neighbors of u and v with respect to the current cut.

It is noted that in this approach, at most only two nearest neighbor calculations are performed for each iteration of the loop. This is in contrast to the prior approaches in which all point-pairs are processed for each additional point-pair to add to the tree. If vertex v is already in the tree, then the nearest neighbor of u that crosses the cut is found. Otherwise, vertex v is added to the tree, and the nearest neighbor of v that crosses the cut must be found as well.

ILLUSTRATIVE EXAMPLE

FIGS. 2-11 provide an illustrative example of an embodiment of the process for determining a minimum spanning tree when applying the method shown in FIG. 1. This example will pictorially show and explain the process of adding point-pairs to the minimum spanning tree. In these figures, the path for a point-pair added to the minimum spanning tree T will be shown with a solid connecting line and the path for a point-pair added to the point-pair list L will be shown with a dashed connecting line. As this example is described, the relevant process actions from FIG. 1 are identified for the sake of exposition.

Figure 2:
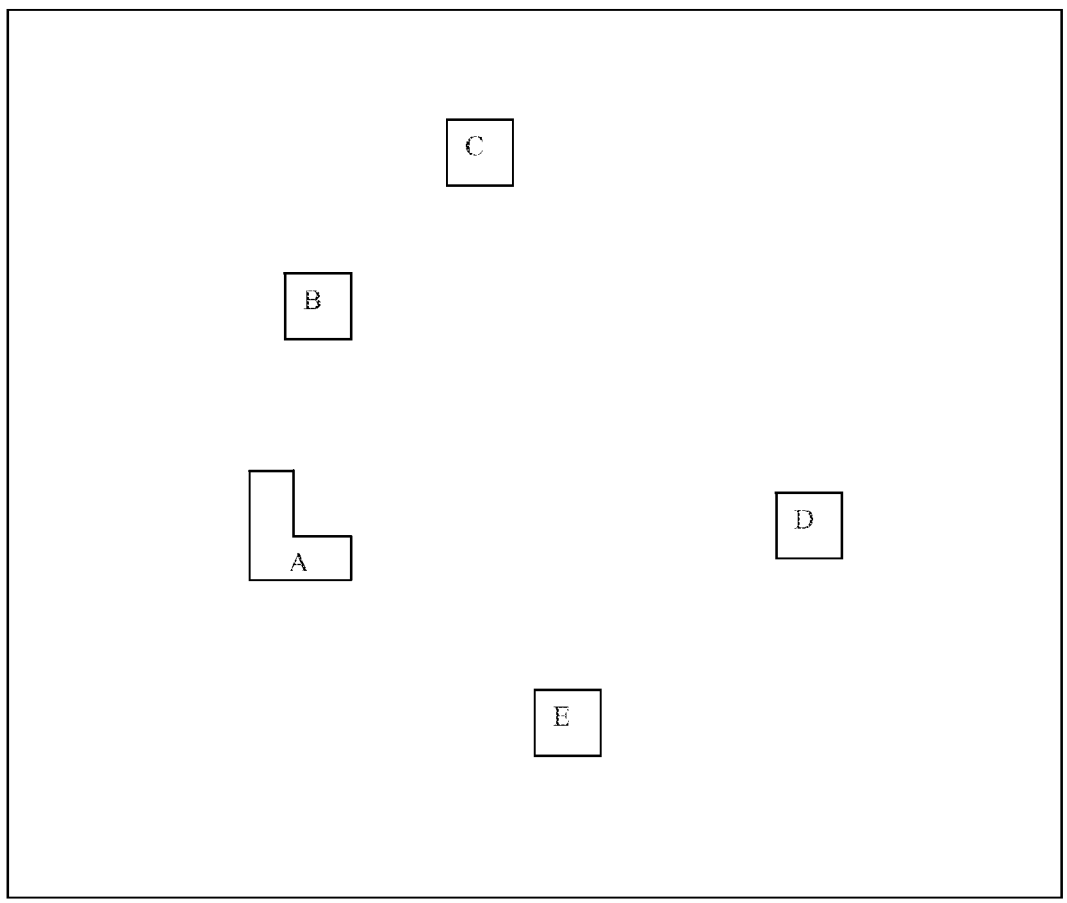
FIGS. 2-11 show an illustrated example of a process for constructing a minimum spanning tree according to an embodiment of the invention.
Figure 3:
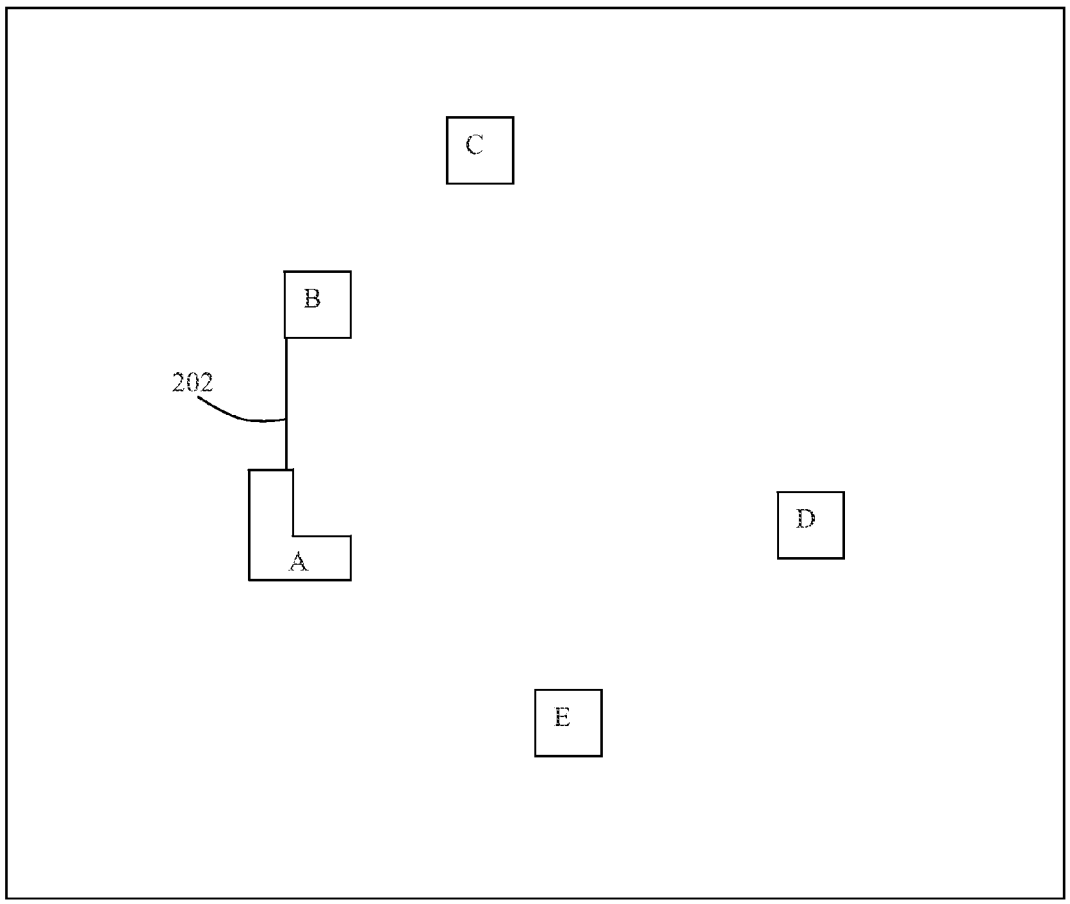

FIG. 2 shows an initial set of points (objects) A, B, C, D, and E. Initially, there are no points in the minimum tree. Assume that point A is selected as the initial Vertex (104). Further assume that the nearest neighbor to point A is point B (106). The initial point-pair A-B is added to the tree (108). The action of adding the point-pair A-B to the tree is pictorially illustrated by the modified set of points shown in FIG. 3. This figure displays a path 202 corresponding to the point-pair A-B added to the minimum spanning tree.

The next action is to determine whether there are any additional points that are not yet in the tree (110). At this time, only points A and B have been added to the tree. Points C, D, and E have not yet been added to the minimum spanning tree. Therefore, the process will continue.

Figure 4:
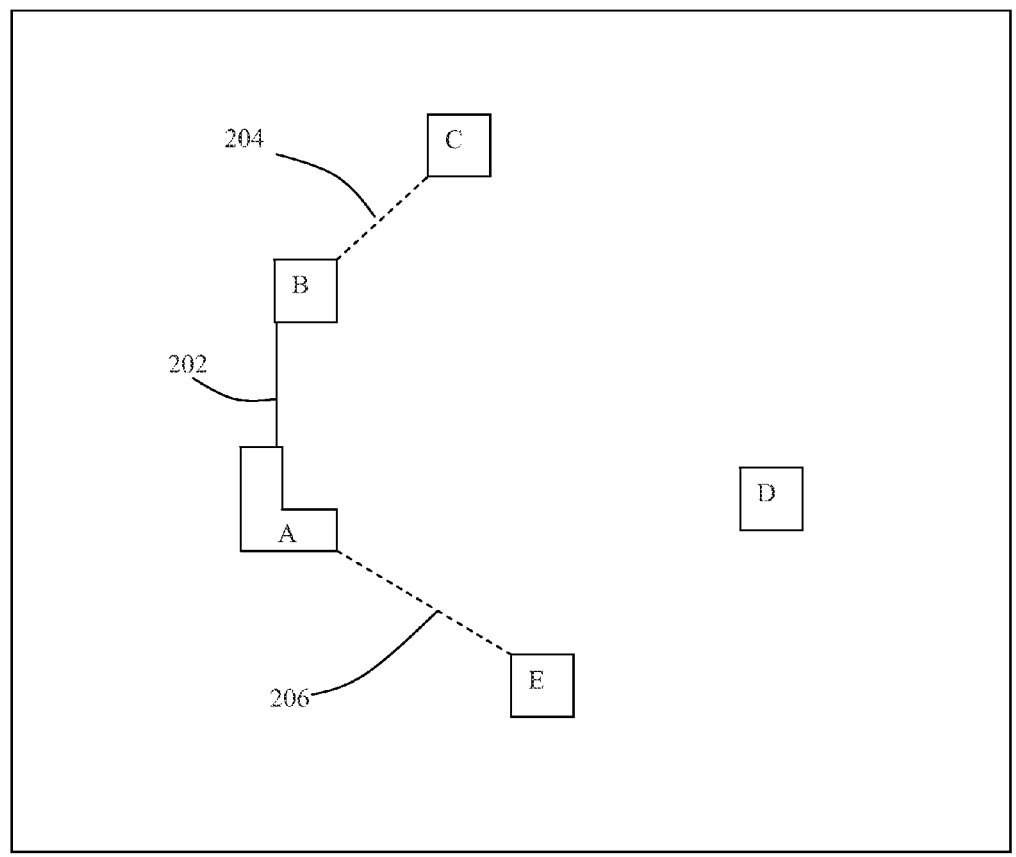

Referring to FIG. 4, an identification is made of the nearest neighbor for each of the points in the point-pair most recently added to the tree (112). Here, the point-pair most recently added to the tree was A-B. Therefore, the nearest neighbor for each of point A and point B are identified. Assume that point C is the nearest neighbor to point B and that point E is the nearest neighbor to point A. Therefore, point-pairs B-C and A-E are added to the point-pair list. This is pictorially illustrated in FIG. 4 by the dashed path 204 for point-pair B-C and the dashed path 206 for point-pair A-E.

Figure 5:
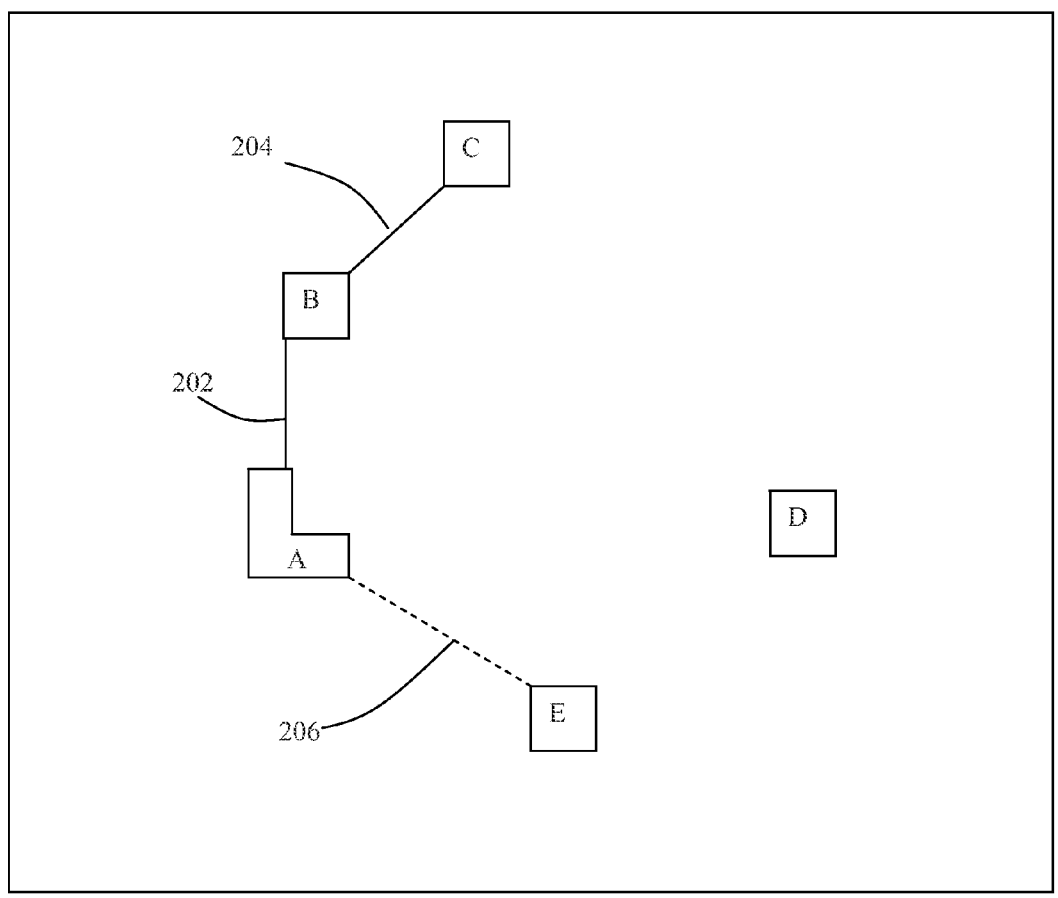

Referring to FIG. 5, the next action is to identify which point-pair in the point-pair list has the shortest distance (114). Assume that the point-pair B-C has a shorter distance than point-pair A-E. A determination is made whether the path 204 for point-pair B-C forms a loop with an existing point in the minimum spanning tree (116). Here, it can be seen that it does not, since point C is not yet in the tree. Therefore, point-pair B-C is added to the minimum spanning tree (118). This is pictorially shown in FIG. 5 by changing path 204 from a dashed line to a solid line.

Once again, a determination is made whether there are any additional points that are not yet in the tree (110). At this time, points A, B, and C have been added to the minimum spanning tree. Points D and E have not yet been added to the tree. Therefore, the process will continue.

Figure 6:
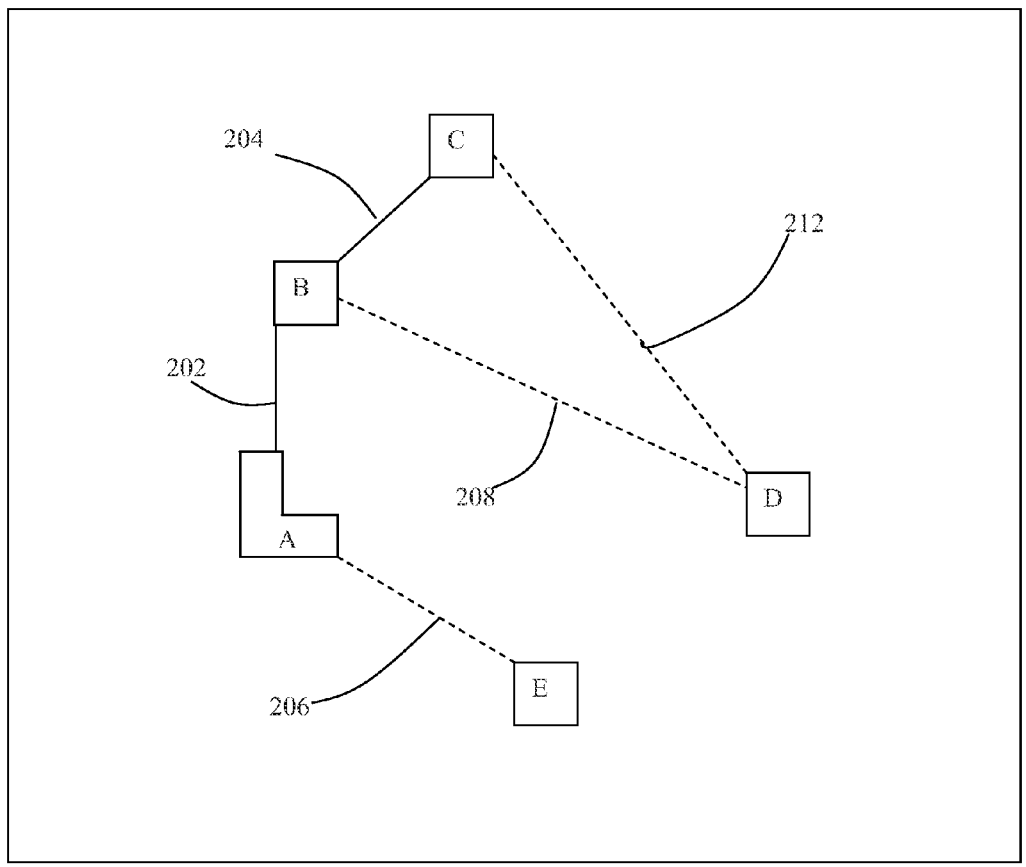

Referring to FIG. 6, identification is made of the nearest neighbor for each of the points in the point-pair most recently added to the tree (112). Here, the point-pair most recently added to the tree was B-C. Therefore, the nearest neighbor for each of points B and C are identified.

Assume that point D is the nearest neighbor to point B. Therefore, point-pair B-D is added to the point-pair list as pictorially shown in FIG. 6 by the dashed path 208 between B and D.

Assume that point D is the nearest neighbor to point C (for points not yet in the tree). Therefore, point-pair C-D is added to the point-pair list. This is pictorially illustrated in FIG. 6 by the dashed path 212 between points C and D.

It is noted that the point-pair (A-E) previously placed in point-pair list still remains in that list. The new point-pairs added to the point-pair list (C-D and B-D) append to the contents of the list rather than replacing the existing list. Thus, the point-pair list now includes A-E, C-D, and B-D. In this manner, the point-pair information previously identified for prior iterations of the nearest neighbor calculations do not need to be re-calculated for points not added to the minimum spanning tree. Instead, that information is retained and is used to determine the next point-pair set that is added to the minimum spanning tree.

This highlights a significant advantage of the present approach. Since the previous point-pair information is retained, each iteration of the process only needs to perform the nearest neighbor calculations for two points—for the two points of the point-pair most recently added to the minimum spanning tree. This is sufficient to maintain information about the nearest neighbor point-pair for every point in the tree, regardless of the number of points already existing in the tree.

Figure 7:
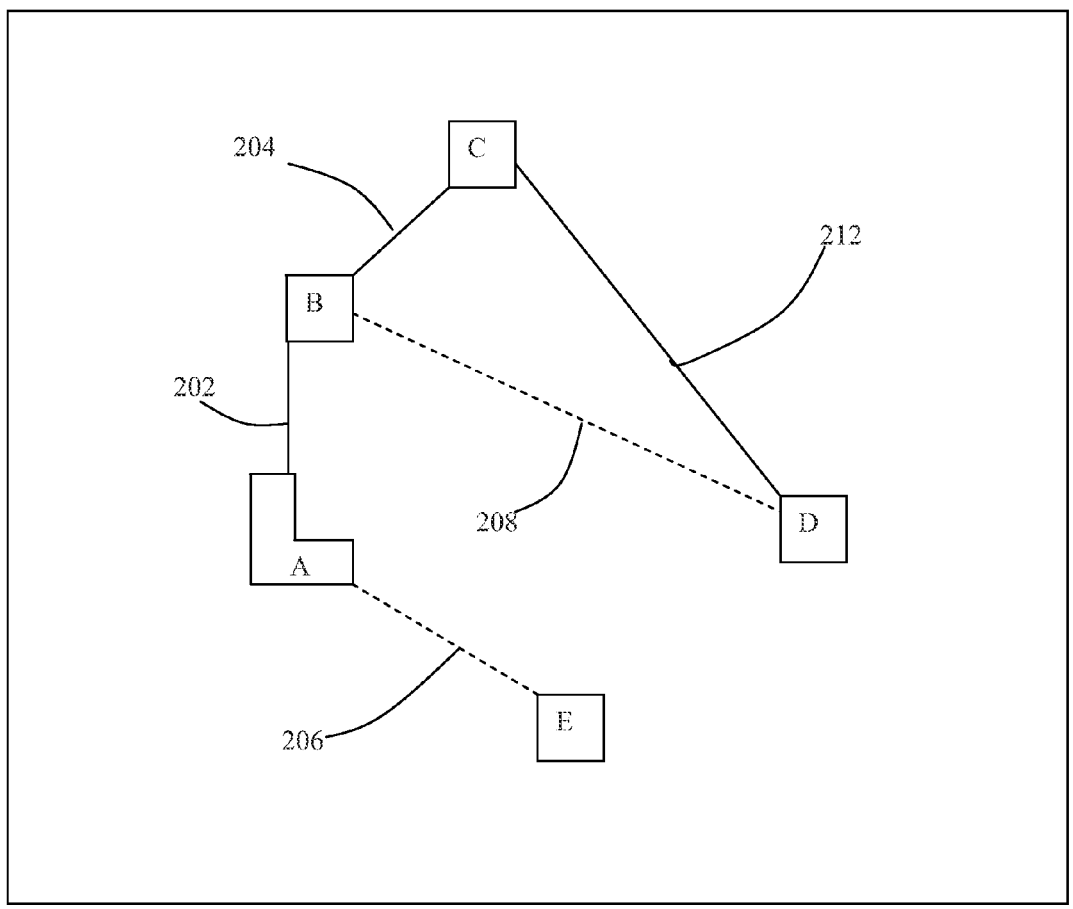

Referring to FIG. 7, the next action is to identify which point-pair in the point-pair list has the shortest distance (114). Assume that the point-pair C-D has a shorter distance than point-pairs A-E and B-D. A determination is made whether the path 212 for point-pair C-D forms a loop with an existing point in the minimum spanning tree (116). Here, it can be seen that it does not, since point D is not yet in the tree. Therefore, point-pair C-D is added to the minimum spanning tree (118). This is pictorially shown in FIG. 7 by changing path 212 from a dashed line to a solid line.

A determination is again made whether there are any additional points that are not yet in the tree (110). At this time, points A, B, C, and D have been added to the minimum spanning tree. However, point E has not yet been added to the tree. Therefore, the process continues.

Figure 8:
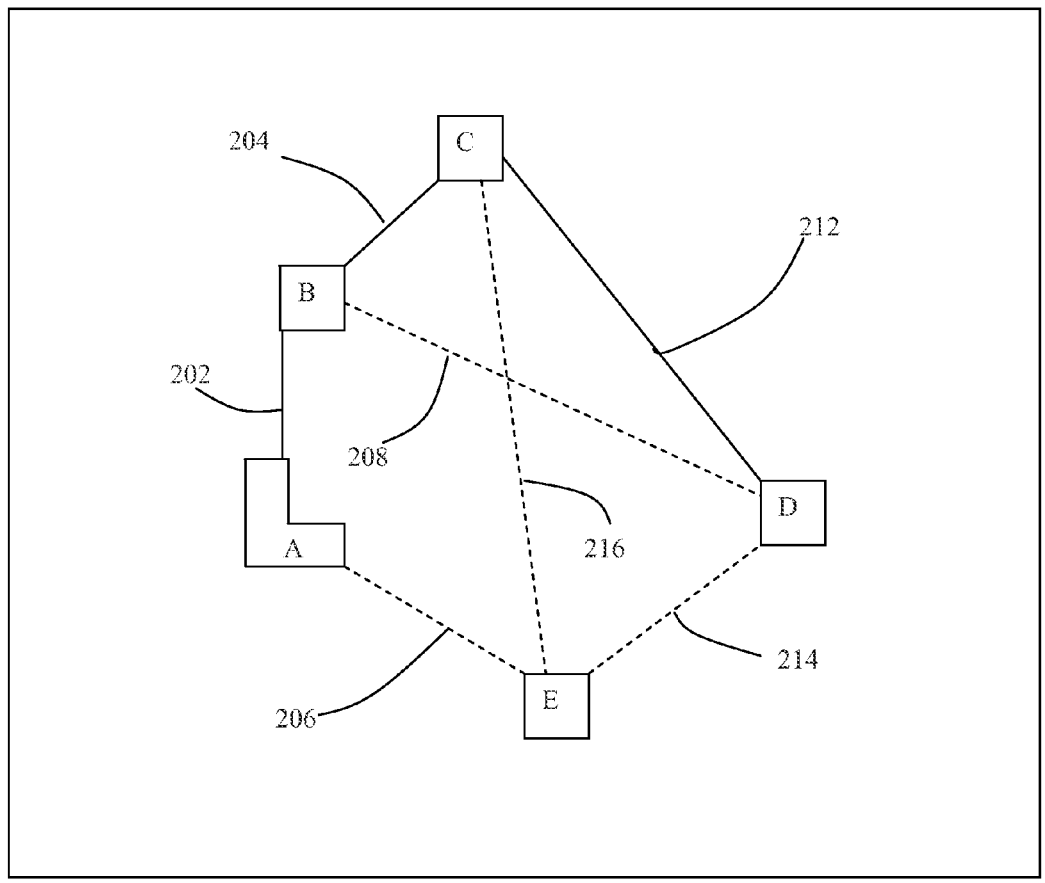

Referring to FIG. 8, identification is made of the nearest neighbor for each of the points in the point-pair most recently added to the tree (112). Here, the point-pair most recently added to the tree was C-D. Therefore, the nearest neighbor for each of points C and D are identified. Assume that point E is the nearest neighbor not yet in the tree to point D and that point E is also the nearest neighbor to point C. Therefore, point-pairs C-E and D-E are appended to the point-pair list. This is pictorially illustrated in FIG. 8 by the dashed path 214 for point-pair D-E and the dashed path 216 for point-pair C-E.

Figure 9:
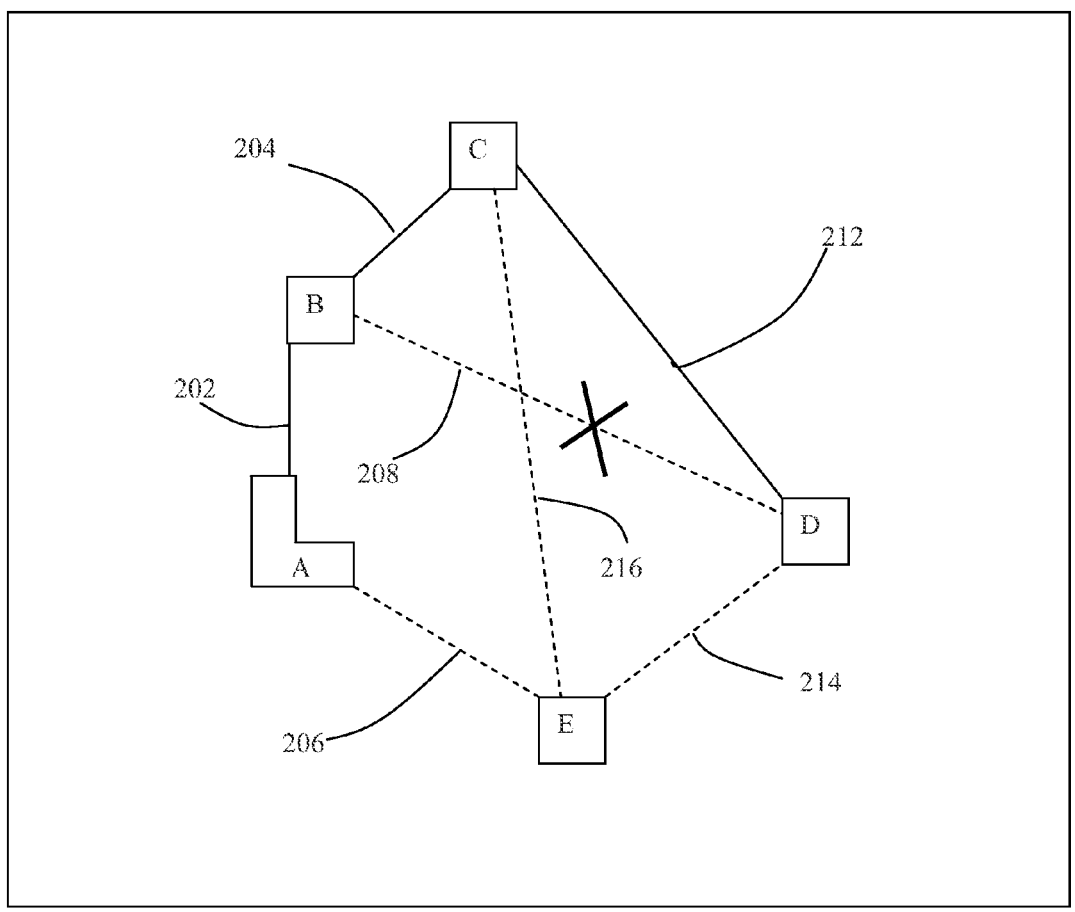
Figure 10:
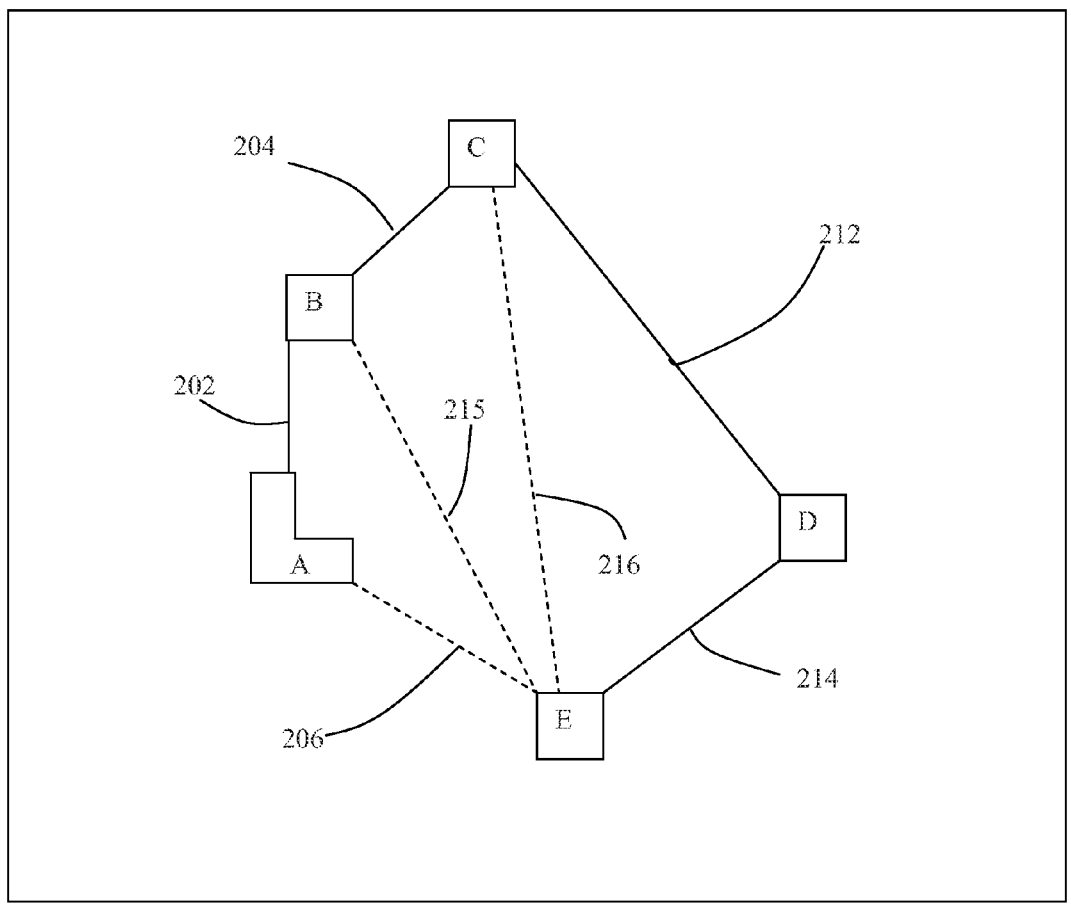

With reference to FIG. 9, the next action is to identify which point-pair in the point-pair list has the shortest distance (114). Assume that path 208 for point-pair B-D has a shorter distance than paths 206, 214, and 216 for point pairs A-E, D-E, and C-E, respectively. A determination is made whether the path 208 for point-pair A-C forms a loop with an existing point in the minimum spanning tree (116). Here, it can be seen that it does, since all the points in point-pair B-D are already in the minimum spanning tree. Therefore, point-pair B-D is not added to the tree; instead, this point-pair is removed from the point-pair list (120). In one embodiment, this point-pair is removed from further eligibility for being selected by the nearest neighbor calculations. This is pictorially shown in FIG. 9 by removal of the path 208 between point B and point D.

A replacement point-pair can be identified for the particular point associated with the removed point-pair. Here, another nearest neighbor calculation is performed for point B, since removed point-pair B-D was identified based upon the nearest neighbor calculation previously performed for point B. Assume that point E is the nearest neighbor to point B, subject to the previous point-pair (B-D) and any other points in the tree being removed from eligibility. Therefore, point-pair B-E is added to the existing point-pair list. This is pictorially illustrated in FIG. 10 by the dashed path 215 between points B and E.

The next action is to determine which point-pair in the point-pair list has the shortest distance (114). Assume that the path 214 for point-pair D-E has a shorter distance than the paths 206, 215, and 216 for point-pairs A-E, B-E, or C-E, respectively. A determination is made whether the path 214 for point-pair D-E forms a loop with an existing point in the minimum spanning tree (116). Here, it can be seen that it does not, since point E is not yet in the tree. Therefore, point-pair D-E is added to the minimum spanning tree (118). This is pictorially shown in FIG. 10 by portraying path 214 as a solid line (from the dashed line in FIG. 9).

Figure 11:
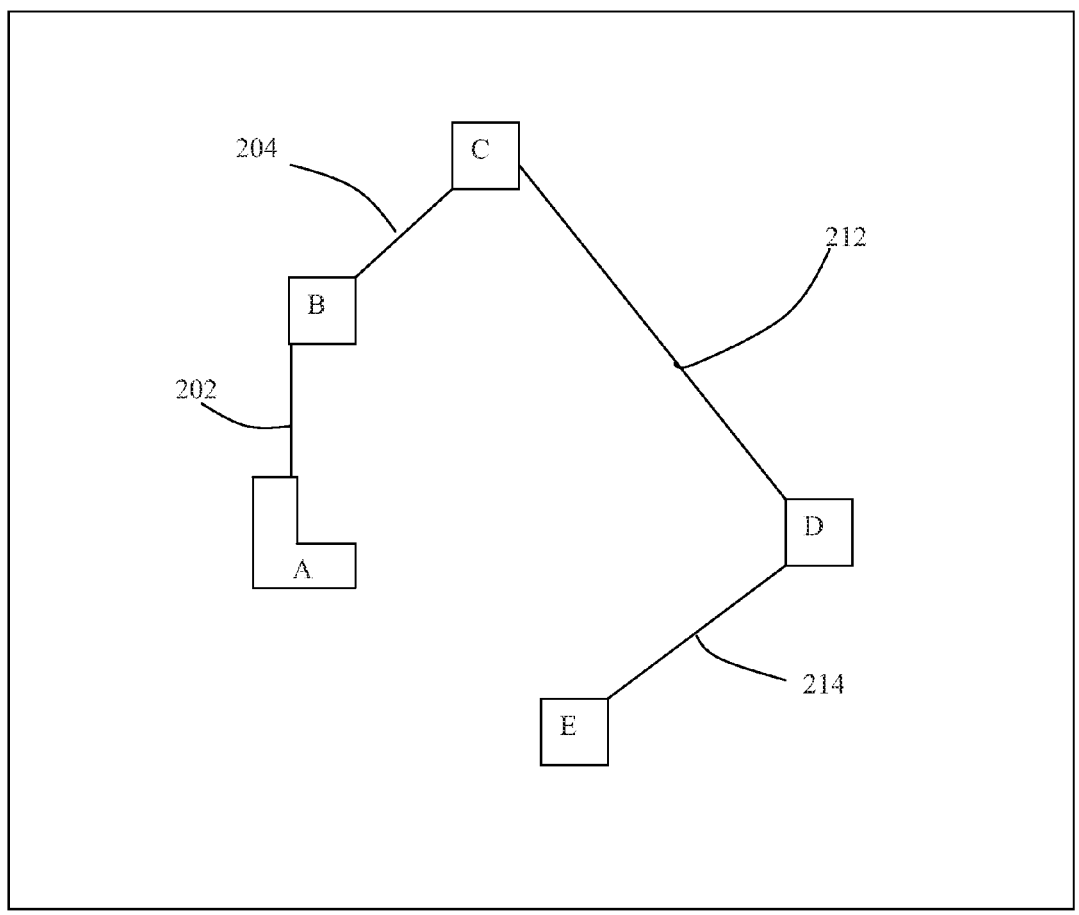

A determination is made whether there are any additional points that are not yet in the tree (110). At this time, points A, B, C, D, and E have all been added to the minimum spanning tree. There are no further points to add to the tree. Therefore, the minimum spanning tree for the set of points {A, B, C, D, E} has been fully constructed. FIG. 11 displays the final form of the minimum spanning tree for this example with paths 202, 204, 212, and 214 showing the point-pairs in the tree.

This minimum spanning tree can be used for a number of practical applications. For example, the tree provides a projection and/or a visualization of shortest connectivity and routing between the points. This connectivity can be used to develop a plan for routing the IC or as an initial estimate/plan for routing the chip. It can form the basis of further estimates for the placement process, such as determining whether the placement can be successfully routed and whether circuit timing constraints can be met.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the exact ordering or content of the described process actions may be changed without affecting the scope or operation of the invention. In addition, points may refer to geometric objects such as sets of rectangles, polygons, and circles. The Euclidean metric may be generalized to any metric. The specification and drawings are, accordingly, to be regarded in an illustrative rather than restrictive sense.

What is claimed is:

1. A computer implemented method for constructing a minimum spanning tree for an integrated circuit product, comprising:
using at least one processor for performing a process, the process comprising:
performing a looping procedure to identify a point-pair for relevant points on the integrated circuit product to add to a minimum spanning tree, wherein
the looping procedure proceeds until all of the relevant points have been included in the minimum spanning tree, and
the looping procedure comprises:
identifying at most two nearest neighbors, which are not yet in the minimum spanning tree, of a first point that already exists in the minimum spanning tree for each iteration of the looping procedure by identifying a first nearest neighbor of the at most two nearest neighbors for the point-pair and a second nearest neighbor of the first nearest neighbor by using one or more metrics; and
determining whether a point in the point-pair forms a loop with one or more existing points that already exist in the minimum spanning tree by at least removing the point-pair from a data structure and by at least identifying a replacement point-pair for the point-pair from the data structure where the point is determined to form a loop with the one or more existing points.

2. The computer implemented method of claim 1 further comprising:
determining whether a shortest point-pair forms a cycle.

3. The computer implemented The method of claim 2 in which the loop is identified based upon whether both points in the shortest point-pair already exist in the minimum spanning tree.

4. The computer implemented The method of claim 2 in which the shortest point-pair is removed from the point-pair list.

5. The computer implemented The method of claim 1 in which the minimum spanning tree is used for routing the integrated circuit product.

6. The computer implemented The method of claim 1 in which the points refers to geometric objects.

7. The computer implemented The method of claim 1 in which the nearest neighbor determination is made using a Euclidean or Manhattan metric.

8. The computer implemented method of claim 1, in which the action of determining whether the point-pair forms a loop with one or more existing point-pairs comprise:
determining whether there already exists a second point of the one or more existing points in the minimum spanning tree that forms the loop with the point-pair;
removing the point-pair from the data structure including one or more point-pairs that have not been added to the minimum spanning tree; and
identifying the replacement point-pair from the data structure for the point-pair to replace the point-pair with the replacement point-pair.

9. The computer implemented method of claim 1, the process further comprising:
tracking a set of point-pairs that may be added to the minimum spanning tree by using a point-pair data structure.

10. The computer implemented method of claim 1, the action of identifying the at most two nearest neighbors comprising:
determining whether a nearest neighbor of the point in the point-pair is already in the minimum spanning tree;
identifying the nearest neighbor as a first nearest point-pair of the at most two nearest neighbors; and
identifying another nearest neighbor of the nearest neighbor as a second nearest point-pair of the at most nearest two point-pairs.

11. The computer implemented method of claim 1, in which
the action of identifying the at most two nearest neighbors is performed for the each iteration that is performed for an identified point in a design of the integrated circuit product; and
the process further comprises:
identifying a data structure that comprises one or more point-pairs, wherein the one or more point-pairs include the point-pair; and
removing the point-pair after the point-pair is determined to be added to the minimum spanning tree.

12. The computer implemented method of claim 1, in which the point in the point-pair comprise a geometric shape instead of a zero-dimensional object.

13. The computer implemented method of claim 1, in which the process further comprises:
removing a first point-pair that already exists in the minimum spanning tree from the minimum spanning tree based at least in part upon a condition.

14. The computer implemented method of claim 1, the process further comprising:
identifying a first data structure including one or more point-pairs that have not been added to the minimum spanning tree;
identifying a new point-pair for the integrated circuit product;
adding the new point-pair to the first data structure by appending the new point-pair to the first data structure, rather than replacing a part of the first data structure.

15. A system for constructing a minimum spanning tree for an integrated circuit product, comprising:
at least one processor for executing a process, the process comprising performing a looping procedure to identify a shortest point-pair for relevant points on the integrated circuit product, wherein
the looping procedure proceeds until all of the relevant points have been included in the minimum spanning tree, and
the looping procedure comprises:
identifying at most two nearest neighbors, which are not yet in the minimum spanning tree, of a first point that already exists in the minimum spanning tree for each iteration of the looping procedure by identifying a first nearest neighbor of the at most two nearest neighbors for the point-pair and a second nearest neighbor of the first nearest neighbor by using one or more metrics; and
determining whether a point in the point-pair forms a loop with one or more existing points that already exist in the minimum spanning tree by at least removing the point-pair from a data structure and by at least identifying a replacement point-pair for the point-pair from the data structure where the point is determined to form a loop with the one or more existing points.

16. The system of claim 15, the at least one processor for executing the process, the process further comprising:
  determining whether a shortest point-pair forms a cycle.

17. The system of claim 16 in which the loop is identified based upon whether both points in the shortest point-pair already exist in the minimum spanning tree.

18. A computer program product comprising a non-transitory computer usable storage medium having executable code which, when executed by at least one processor, causes the at least one processor to execute a method for constructing a minimum spanning tree for an integrated circuit product, the method comprising:
  using the at least one processor for performing a process, the process comprising:
    performing a looping procedure to identify a shortest point-pair for relevant points on the integrated circuit product, wherein
      the looping procedure proceeds until all of the relevant points have been included in the minimum spanning tree, and
      the looping procedure comprises:
        identifying at most two nearest neighbors, which are not yet in the minimum spanning tree, of a first point that already exists in the minimum spanning tree for each iteration of the looping procedure by identifying a first nearest neighbor of the at most two nearest neighbors for the point-pair and a second nearest neighbor of the first nearest neighbor by using one or more metrics; and
        determining whether a point in the point-pair forms a loop with one or more existing points that already exist in the minimum spanning tree by at least removing the point-pair from a data structure and by at least identifying a replacement point-pair for the point-pair from the data structure where the point is determined to form a loop with the one or more existing points.

19. The computer program product of claim 18, the process further comprising:
  determining whether a shortest point-pair forms a cycle.

20. The computer program product of claim 19 in which the loop is identified based at least in part upon whether both points in the shortest point-pair already exist in the minimum spanning tree.

* * * * *